US008378866B2

(12) United States Patent
Ikagawa

(10) Patent No.: US 8,378,866 B2
(45) Date of Patent: Feb. 19, 2013

(54) CONTROLLER TO CONTROL ELECTRICAL POWER OF LOAD IN CONSTANT

(75) Inventor: Tomoko Ikagawa, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 105 days.

(21) Appl. No.: 13/085,577

(22) Filed: Apr. 13, 2011

(65) Prior Publication Data

US 2011/0254715 A1 Oct. 20, 2011

(30) Foreign Application Priority Data

Apr. 20, 2010 (JP) ................................ 2010-097094

(51) Int. Cl.
*H03M 1/00* (2006.01)

(52) U.S. Cl. ......................................... 341/142; 324/95

(58) Field of Classification Search .................. 341/142; 324/95, 84, 637, 750, 639, 501
See application file for complete search history.

(56) References Cited

U.S. PATENT DOCUMENTS 5,739,416 A * 4/1998 Hoenk ........................ 73/29.01
7,812,594 B2 10/2010 Ishikawa et al.

OTHER PUBLICATIONS

Ishikawa et al., "High-Power Single-Stripe Full-Band Tunable Laser Using Tunable Reflector with Wavelength-Filter Function", IEICE Technical Report OPE2008-29, LQE2008-30 (Jun. 2008), pp. 51-56.

* cited by examiner

*Primary Examiner* — Joseph Lauture
(74) *Attorney, Agent, or Firm* — Smith, Gambrell & Russell, LLP

(57) ABSTRACT

A heater controller for controlling a heater precisely in the equi-power mode is disclosed. The controller includes a current source, a voltage monitor to detect a voltage drop caused in the heater, and a controller. The voltage drop may be converted to the digital form as refereeing to the first reference, while, the heater current is converted from the digital form as referring to the second reference. The second reference shows substantial temperature dependence, while, the first reference has lesser temperature dependence. The control corrects the temperature dependence of the second reference as referring to the first reference.

9 Claims, 7 Drawing Sheets

CONTROLLER TO CONTROL ELECTRICAL POWER OF LOAD IN CONSTANT

BACKGROUND OF THE INVENTION

1. Field of the Invention

The present invention relates to a load controller that controls the load in the equi-power mode.

2. Related Prior Arts

An U.S. Pat. No. 7,812,594, has disclosed an optical device and a method to control the device. The optical device disclosed therein provides an optical waveguide whose refractive index may be adjusted by a heater integrated within the device. Generally, the heater may be controlled in the equi-power mode by monitoring at least one of a current flowing therein and a voltage applied to the heater.

The optical device reported in a conference of OPE 2008-29 (LQE2008-30) held in June, 2008, is a type of a tunable laser diode (hereafter denoted as LD) that includes an semiconductor optical amplifier (SOA), a distributed feedback LD (DFB-LD), and a chirped sampled grating distributed Bragg reflector (CSG-DBR), where those elements are integrated within a common semiconductor substrate. The reflection spectrum of the CSG-DBR may be adjusted by the heater, specifically, an average temperature and temperature distribution thereof, also the emission spectrum of the DFB-LD may be adjusted by an average temperature of the DFB-LD.

When the heater is control in the equi-power mode to control the output wavelength of the tunable LD, a precise monitoring of the current and the voltage applied to the heater are sometimes necessary. In particular, when the tunable LD is applied to the DWDM (Dense Wavelength Division Multiplexing) system, the power provided to the heater is necessary to be precisely kept constant.

For the equi-power control of the heater, voltages in both ends of the heater and a current flowing therein are monitored; and the voltage and the current are controlled such that the electrical power calculated from the monitored voltages and the current becomes equal or close to the target power. FIG. 5 is a block diagram of a conventional heater controller 100 that monitors both of the current and the voltage. The heater controller 100 provides a current source 101 to provide current for the heater H, a current monitor 102 to monitor the current, a controller 103 to control the current. The controller 103 receives the current data $I_{mon}$ from the current monitor 102 through the analog-to-digital converter (hereafter denoted as A/D-C) 104, and two voltage data, $V_{Hmon}$ and $V_{Lmon}$, which correspond to voltages measured at both ends of the heater H through the A/D-C 104. The controller 103 calculates the electrical power at the heater H from those data, and generates a control signal to the current source 101 through the digital-to-analog converter (hereafter D/A-C) 105 such that the calculated electrical power is equal or close to the target power.

FIG. 6 is an example of the current monitor 102 that includes a sensing resistor 112 and a differential amplifier 113 that amplifies a voltage difference caused by the sensing resistor 112.

The conventional heater controller 100 shown FIG. 6 inherently has a subject that the controller is necessary to provide, in addition to the voltage monitor to monitor the voltages of both ends of the heater H, the current monitor 102 to monitor the current, which forces the size of the controller in large. Recent optical module applicable for the tunable LD, for instance, a tunable XFP optical transceiver, requests the package thereof as small as possible. So the heater controller with the conventional current monitor is inconsistent with such request.

SUMMARY OF THE INVENTION

An aspect of the present invention relates to a load controller to control a load in the equi-power mode. The load controller comprises a current source, a D/A-C, an A/D-C and a controller. The current source supplies a current to the load. The A/D-C is coupled with the first reference. The D/A-C is coupled with the second reference that has temperature dependence greater than the temperature dependence of the first reference. The controller controls the current source through the D/A-C by receiving the output of the A/D-C. In the present invention, the controller may receive the second reference through the A/D-C, correct the temperature dependence of the second reference, and output a corrected signal to the D/A-C. Thus, the current provided to the load may be precisely compensated with the temperature dependence of the second reference.

Another aspect of the present invention relates to a method to control electrical power supplied to a load in constant to the target power by a feedback loop. This feedback loop may include the A/D-C configured to refer the first reference, the controller, the D/A-C configure to refer the second reference and the current source. The second reference of the D/A-C has greater temperature dependence compared to the first reference. The method of the invention may include steps of: (1) detecting, through the A/D-C, a voltage drop caused in the load by a current flowing therein; (2) detecting, through the A/D-C, the second reference; (3) calculating by the controller the current next supplied to the load through the D/A-C and the current source as correcting the temperature dependence of the second reference; and (4) providing the calculated and corrected current to the load.

The calculating of the next current may include steps of: (3-1) dividing the target power by the voltage drop in order to estimate the current next supplied to the load; and (3-2) correcting the estimated current by multiplying a ratio of the detected second reference to a designed second reference, where the designed second reference may be a value of the second reference when the target power is first satisfied.

In another embodiment, the step of calculating of the next current may include steps of: (3-1) calculating the current presently flowing in the load from a preset output of the controller and the target power; (3-2) correcting the calculated present current by multiplying a ratio of the designed second reference to the detected second reference; (3-3) calculating present power from the corrected current and the voltage drop; and (3-4) calculating next output of the controller from the calculated present power and the target power by multiplying the preset output by a ratio of the target power to the calculated present power.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS

Next, some preferred embodiments according to the present invention will be described as referring to drawings. In the description of the drawings, the same numerals or symbols will refer to the same elements without overlapping explanations.

Figure 1:
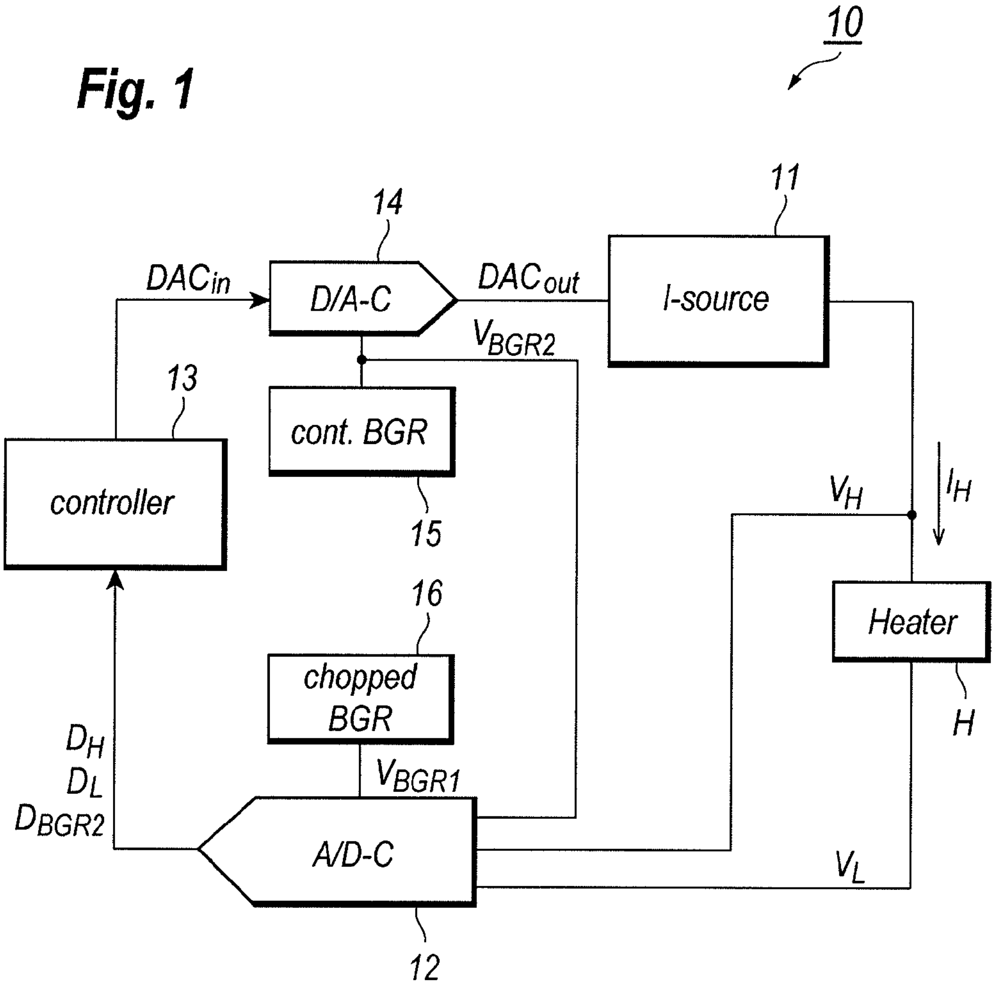
FIG. 1 is a block diagram of a heater controller according to an embodiment of the present invention.

FIG. 1 is a block diagram of a heater controller 10 according to an embodiment of the present invention. The heater controller 10 may control the electrical power supplied to the heater H in constant. The heater H may be installed or integrated within a tunable semiconductor LD; but the heater controller 10 of the present embodiment is not restricted to control those heaters.

As shown in FIG. 1, the heater controller 10 includes a current source 11, an A/D-C 12, a controller 13, a D/A-C 14, a continuous band-gap reference (hereafter denoted as BGR) 15, and a chopped BGR 16. The current source 11 provides a current to the heater H. Specifically, the current source 11 provides a heater current $I_H$ to the heater H which corresponds to a control signal DACout provided from the controller 13 through the D/A-C 14.

One of inputs of the A/D-C 12 is coupled with one terminal of the heater H; while, another inputs is coupled with the other terminal of the heater H. Thus, the A/D-C 12 may convert monitored voltages, $V_H$ and $V_L$, of the heater H into digital variables, $D_H$ and $D_L$, and provide these variables to the controller 13. The A/D-C 12 may further convert the second reference $V_{BGR2}$ output from the continuous BGR 15 into another digital variable $D_{BGR2}$, and transmit them to the controller 13.

The controller 13 generates the digital control signal DACin and transmits it to the current source 11. That is, the control signal DACin corresponds to the magnitude of the current output from the current source 11 to the heater H, and this control signal DACin may be determined in the controller 13 such that the electrical power supplied to the heater H is set constant in a preset value. The controller 13 may further receive the variable $D_{BGR2}$ from the chopped BGR 16 through the A/D-C 12, which is used to correct the output control signal DACin.

The D/A-C 14 may convert the digital control signal DACin into an analog control signal DACout, and transmits this analog signal DACout to the current source 11. The continuous BGR 15, which is coupled with the reference input of the D/A-C 14, provides the second reference $V_{BGR2}$ to the D/A-C 14. On the other hand, the chipped BGR 16, which is coupled with the reference input of the A/D-C 12, provides the first reference $V_{BGR1}$ which operates as a reference for the conversion in the A/D-C 12.

Figure 2:
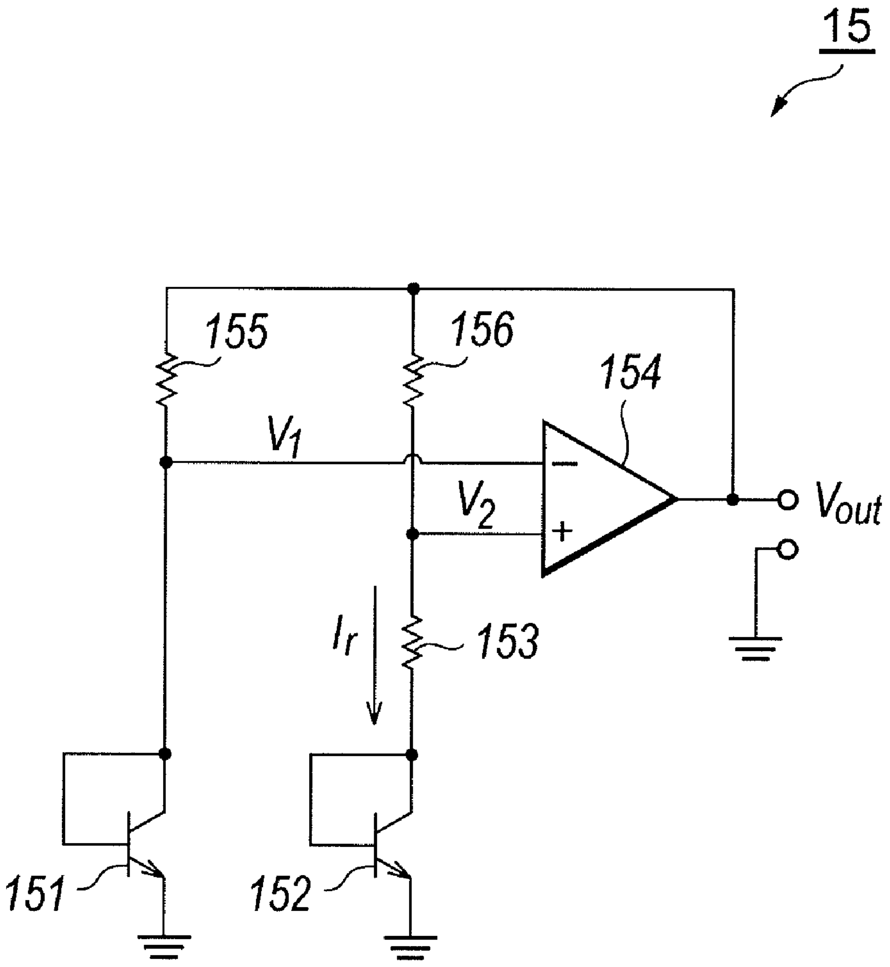
FIG. 2 is a circuit diagram of a continuous BGR according to an embodiment of the present invention.

FIG. 2 is an example of a circuit diagram of the continuous BGR 15. The continuous BGR 15 includes a pair of transistors, 151 and 152, each of which is configured with a diode connection, that is, the base and the collector thereof are short-circuited, three resistors, 153 to 156, and a differential amplifier 154. Two resistors, 153 and 156, are connected in series to one of transistors 152, while, the rest resistor 155 is connected in series to the other transistor 151. The inverting input of the differential amplifier 154 is connected to one of the transistor 151, while, the non-inverting input thereof is connected to the other transistor. The resistor 155 is put between the output and the inverting input of the differential amplifier 154, while, the other resistor 156 is put between the output and the on-inverting input of the differential amplifier 154.

The continuous BGR 15 shown in FIG. 2, which provides the differential amplifier whose output is fed back to two resistors, 155 and 156, generates the output thereof by an operation of the differential amplifier 154 such that two inputs thereof become substantially equal to the others, that is, the input voltages, $V_1$ and $V_2$, becomes equal to the others. Assuming the resistance of resistors, 155 and 156, are equal, then, the output Vout of the differential amplifier becomes;

$$V_{OUT} = V_{BE}^{(152)} + (V_T \times \ln(r)/R^{(153)}) \times (R^{(156)} + R^{(153)}) = V_{BE}^{(152)} + V_T \times \ln(r) \times (1 + R^{(156)}/R^{(153)}), \quad (1)$$

where $V_{BE}^{(152)}$, r, and $V_T$ are the bias voltage between the base and the emitter of the second transistor 152, the ratio of the size of the transistors, 151 and 152, and the voltage which is proportional to temperature. The base bias $V_{BE}$ shows negative temperature dependence; while, the second term in equation (1) shows negating temperature dependence. Then, respective temperature dependence may be substantially cancelled such that errors appeared in the output Vout may be reduced to about 1% including the scattering in the device performance due to the process instability.

Moreover, the differential amplifier 154 inherently shows an offset voltage with a magnitude thereof sometimes beyond several scores of milli-volts. The offset voltage of the differential amplifier has temperature dependence which is often larger than the error derived from the base bias $V_{BE}$ of the transistor. Accordingly, the offset voltage of the differential amplifier 154 result in insufficient accuracy to control the monolithic heater H implemented within the tunable LD in the equi-power mode.

Figure 3:
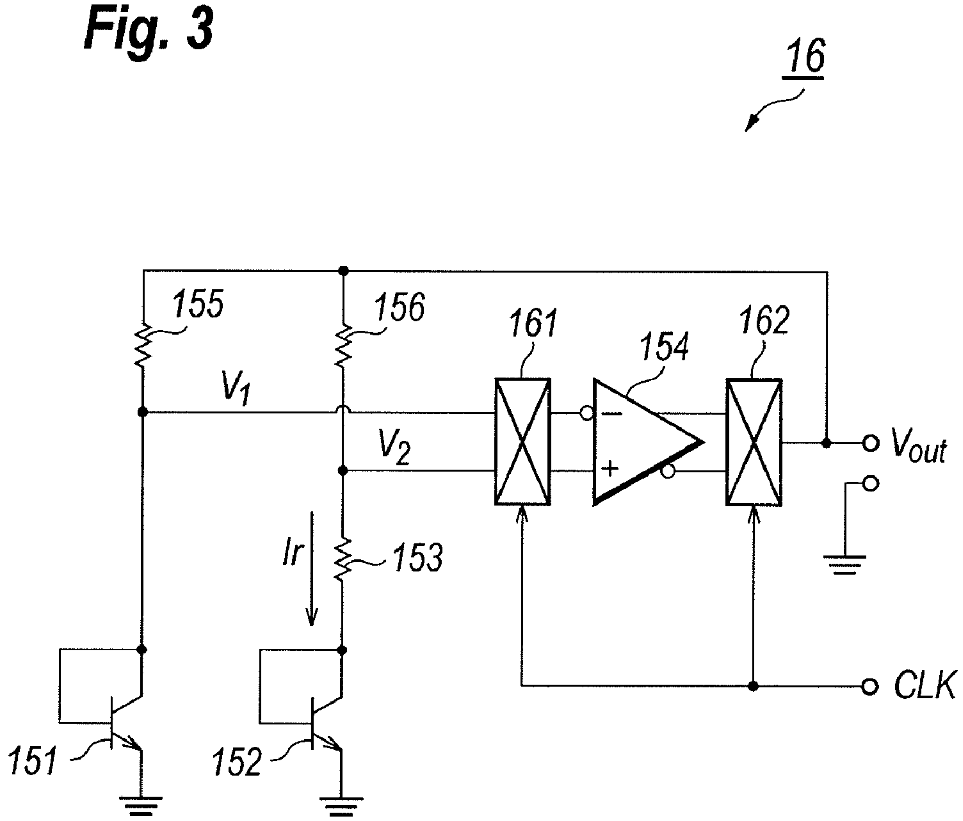
FIG. 3 is a circuit diagram of a chopped BGR according to an embodiment of the present invention.

The chopped BGR 16 of the present embodiment may compensate such residual errors of the differential amplifier 154. FIG. 3 is a block diagram of the chopped BGR 16 according to an embodiment of the present invention. The chopped BGR 16 shown in FIG. 3 may include, in addition to the arrangement shown in FIG. 2, two switches 161 and 162. The first switch 161 is put between two inputs of the differential amplifier 154 and two bipolar transistors, 151 and 152, while, the other switch 162 is put between the outputs of the differential amplifier 154 and the output terminal. These two switches, 161 and 162, are synchronously driven by an external clock CLK. Specifically, in one event, the inverting input of the differential amplifier 154 is coupled with the node providing the voltage $V_1$, the non-inverting input thereof is coupled with the other node providing the voltage $V_2$, and the non-inverting output is fed back to two resistors, 155 and 156, and also to the output terminal. While, the other event subsequent to the above event, the inverting input of the differential amplifier 154 is coupled with the node providing the voltage $V_2$, the non-inverting input is coupled with the other node providing the voltage $V_1$, and the inverting output is fed back to the resistors, 155 and 156, and to the output terminal.

Averaging the output Vout of the chopped BGR 16, the first reference $V_{BGR1}$ may by obtained.

Figure 4:
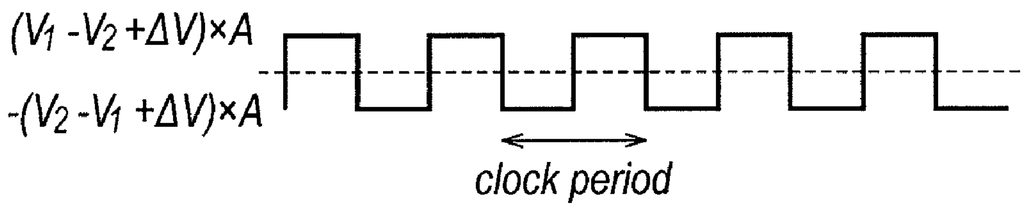
FIG. 4 schematically shows a waveform output from the chopped BGR.
Figure 5:
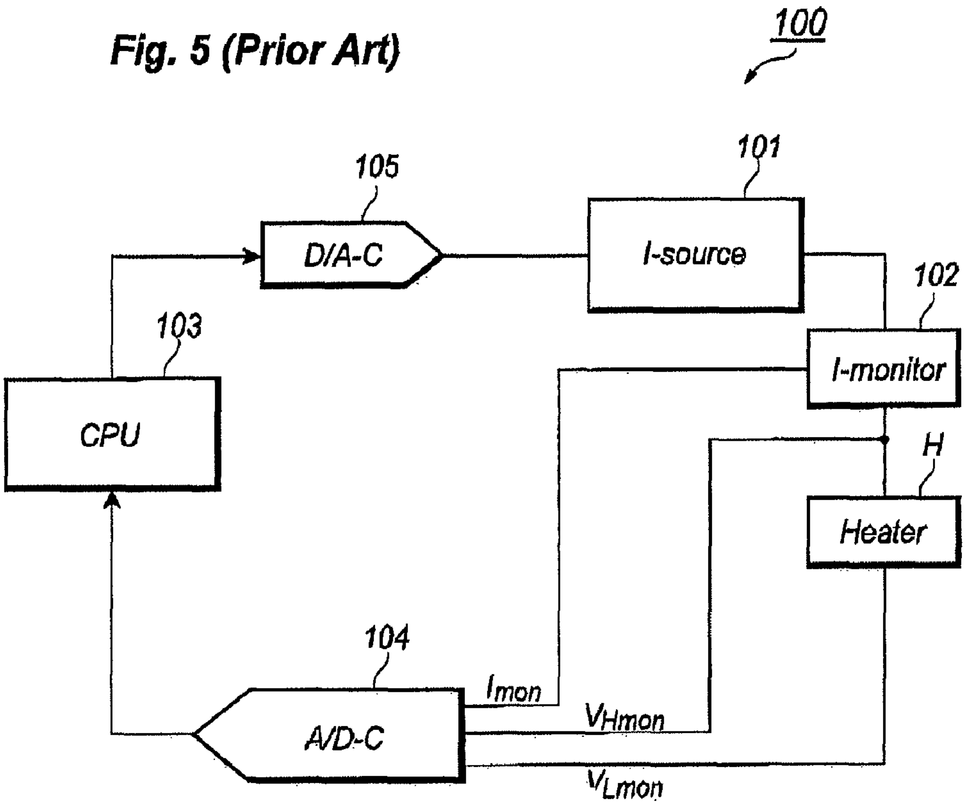
Fig. 5 (Prior Art)
FIG. 5 shows a conventional heater controller that monitors both voltage and current.
Figure 6:
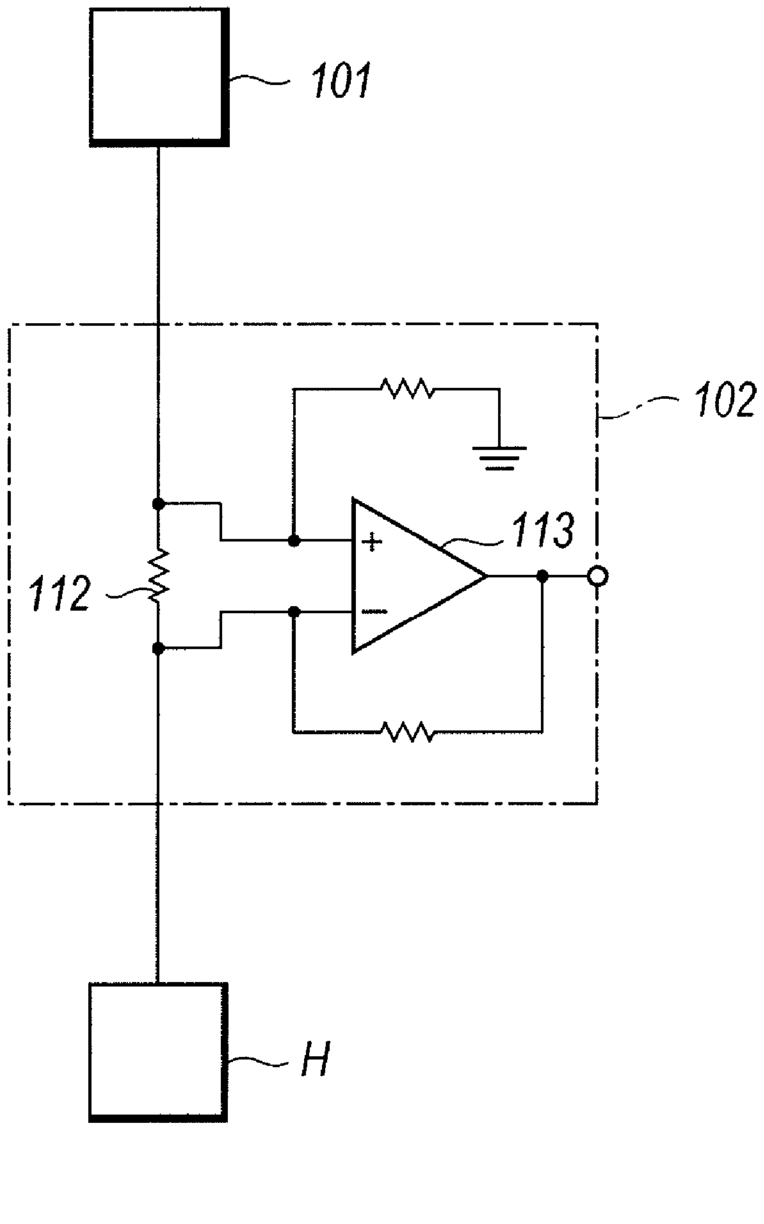
FIG. 6 shows an example of the current monitor implemented within the conventional heater controller.

FIG. 4 shows a waveform of the output Vout provided from the chopped BGR 16. The output Vout shows an error ΔV around the target value due to the offset voltage which has temperature dependence inherently accompanied with the differential amplifier 154. In the chopped BGR 16, when the clock is in the low level, which corresponds to the second event described above, the output Vout becomes $-(V_2-V_1+\Delta V)\times A$, where A is a loop gain of the differential amplifier 154; while, in the first event where the clock is in the high level, the output Vout becomes $(V_1-V_2+\Delta V)\times A$. Then, averaging the output Vout of the chopped BGR 16, the term regarding the error ΔV disappears and the output thereof may converge in the target first reference $V_{BGR1}$ with only error derived from the base bias. The A/D-C 12 may use this first reference $V_{BGR1}$ for the conversion. The D/A-C 14 may also use the reference thereof output form a reference generator with the arrangement similar to the chopped BGR 16. However, the output Vout provided from the chopped BGR 16 often accompanies with switching noise synchronous with the external clock, and this noise may cause a failure in the conversion to the analog signal. Accordingly, the reference for the D/A-C 14 is preferable to be provided from the continuous BGR 15.

The BGR circuit is quite effective in a viewpoint of making the circuit in compact, but it shows an inherent temperature dependence, which typically reaches or sometimes exceeds 250 ppm/° C. The chopped BGR 16 shown in FIG. 3 may suppress the fluctuation of the voltage output due to the change of the temperature, but, the output thereof inherently includes switching noises, which is inadequate to apply the circuit to the D/A-C 14 as a reference because the D/A-C 14 is necessary to refer the reference thereof during the whole conversion sequence. Accordingly, the chopped BGR 16 is inadequate to be applied for the D/A-C 14; in particular, the D/A-C 14 is provided for a precise analog circuit such as the heater control for the tunable LD. On the other hand, the A/D-C 12 may refer the reference thereof intermittently. Accordingly, the chopped BGR 16 may be applicable to the A/D-C 16 by setting the conversion period so as to avoid the switching noise.

The heater control circuit 10 according to the present invention provides the continuous BGR 15 that outputs the second reference $V_{BGR2}$ containing substantial temperature dependence, and the chopped BGR 16 that outputs the first reference $V_{BGR1}$ containing relatively larger switching noise. Moreover, the A/D-C 12 receives the second reference $V_{BGR2}$ from the continuous BGR 15 in addition to two voltages, $V_H$ and $V_L$, from the heater H. Because the A/D-C 12 converts this second reference $V_{BGR2}$ based on the first reference $V_{BGR1}$, the digital variable $D_{BGR2}$ converted from the second reference $V_{BGR2}$ may precisely reflect the temperature dependence of substantially only the second reference $V_{BGR2}$. The controller 13 may compensate, based on the variable $D_{BGR2}$ derived from the second reference $V_{BGR2}$, may correct the control signal DACout which determines the heater current $I_H$ output from the current source 11. Thus, the heater control circuit 10 may precisely control the electrical power supplied to the heater H independent of the temperature.

Figure 7A:
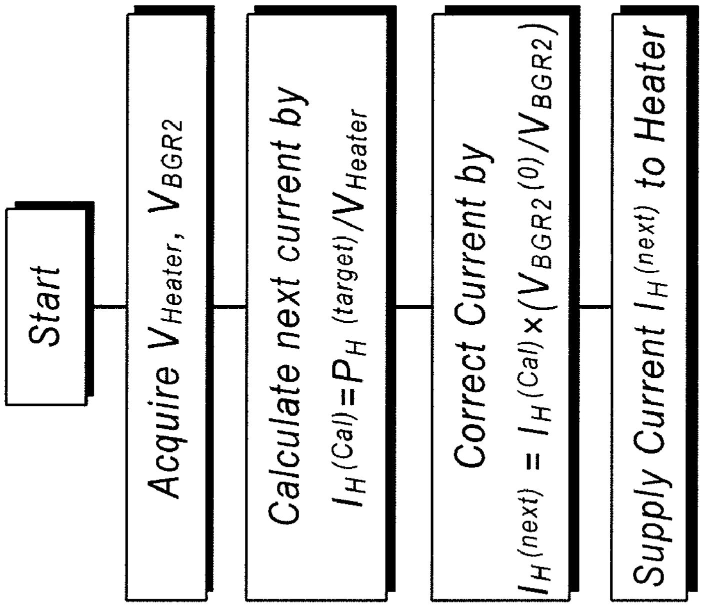
FIG. 7A is a flow chart explaining a method to control the heater controller according to one embodiment of the invention.

Next, specific examples of a method to control the heater according to the heater control circuit 10 will be described as referring to FIG. 7A. The A/D-C 12 converts the voltages, $V_H$ and $V_L$, which correspond to respective terminals of the heater H, and the second reference $V_{BGR2}$ output from the continuous BGR 15 into digital variables, $D_H$, $D_L$, and $D_{BGR2}$, as referring to the first reference $V_{BGR1}$. The first reference $V_{BGR1}$ as described above shows lesser temperature dependence; the conversion to the digital form may be precisely carried out independent of the temperature. Because the heater H is necessary to be operated in the equi-power mode, the controller 13 may calculate the current next to be supplied to the heater H based on the voltage drop, $V_{Heater}=V_H-V_L$, currently caused in the heater H and the target power. Then, the controller 13 may compensate the current thus calculated taking the temperature dependence of the output from the continuous BGR 15 as referring to the variable $D_{BGR2}$. Finally, the controller 13 may output thus corrected result DACin to the D/A-C 14.

Describing further specifically, when the temperature dependence of the continuous BGR 15 is ignored, the controller 13 compares a product of the voltage drop $V_{Heater}$ of the heater H multiplied by the current $I_H$, which may be directly estimated from the control signal DACout, with the target power, and outputs the control signal DACin that is re-calculated such that a difference between the target power and the currently calculated power is multiplied by a preset gain. That is, when the second reference $V_{BGR2}$ is shifted from the designed reference $V_{BGR2}^{(0)}$, the output DACout of the D/A-C 14 shifts by a ratio of $V_{BGR2}/V_{BGR2}^{(0)}$ from the practically necessary value. For instance, assuming the resolution of the D/A-C 14 is x bits and the conductance of the current source 11 is gm(A/V), the current $I_{HC}$ calculated by the controller 13 is:

$$I_{HC}=\{DACin/(2^x-1)\}\times V_{BGR2}^{(0)}\times gm \quad (2)$$

However, because the second reference is shifted to $V_{BGR2}$ from the designed value $V_{BGR2}^{(0)}$, the practical current supplied to the heater becomes:

$$I_H=\{DACin/(2^x-1)\}\times V_{BGR2}\times gm \quad (3).$$

Thus, the heater current $I_H$ practically supplied to the heater H shifts from the designed value.

The heater controller 10 of the present embodiment, the controller 13 may calculate the output DACin for the D/A-C 14 which is corrected by a factor $(V_{BGR2}^{(0)}/V_{BGR2})$ in advance to be practically provided to the D/A-C 14; accordingly, the practical heater current $I_H$ may be compensated. That is, setting the output to the D/A-C 14 from the controller 13 including the correction to be $DACin^{(correct)}$, $$DACin^{(correct)}=DACin\times(V_{BGR2}^{(0)}/V_{BGR2}) \quad (4).$$

Then, the heater current $I_H$ practically provided to the heater H becomes:

$$I_H=\{DACin^{(correct)}/(2^x-1)\}\times V_{BGR2}\times gm = \{DACin/(2^x-1)\}\times V_{BGR2}^{(0)}\times gm. \quad (5)$$

Thus, the heater controller 10 of the present embodiment may perform the precise control of the heater H in the equi-power mode without the current monitor.

Figure 7B:
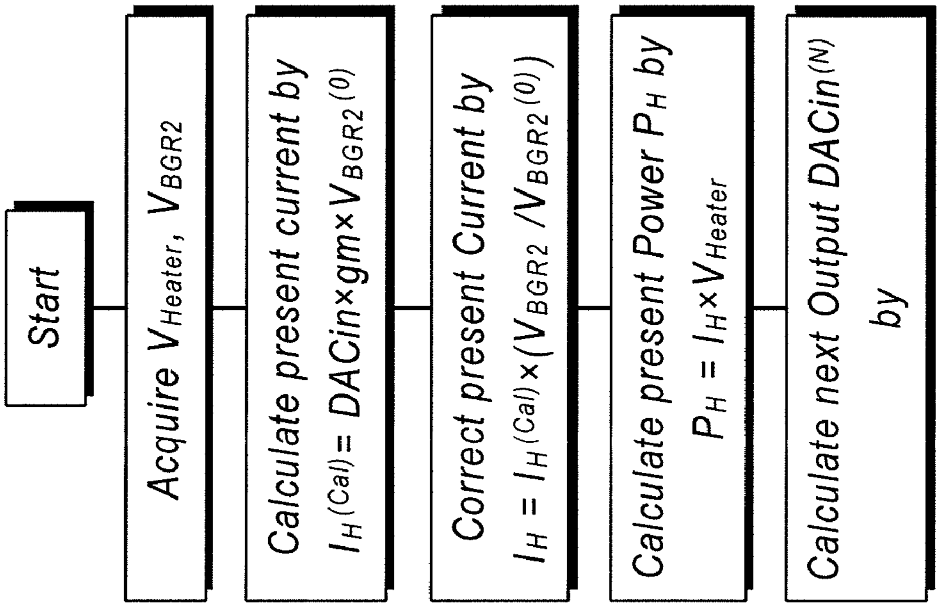
FIG. 7B is a flow chard showing a method to control the heater controller according to another embodiment of the invention.

The method to control the heater H precisely is not restricted to those embodiments described above, which directly corrects the output DACin from the controller 13. For instance, the correction may be carried out by correcting the current electrical power supplied to the heater H, as shown in FIG. 7B. Specifically, the controller 13 may acquire variables of the voltage drop $V_{Heater}$ at the heater and the current second reference $V_{BGR2}$. The current $I_H^{(cal)}$ presently supplied to the heater may be estimated from the output DACin of the controller 13 based on the designed second reference $V_{BGR2}^{(0)}$ by:

$I_H^{(cal)}=DAC\text{in}\times gm\times V_{BGR2}^{(0)}$.

But this estimated current is necessary to be corrected based on the current second VBGR2 to obtain the practical current supplied to the heater H by:

$$I_H = I_H^{(cal)} \times (V_{BGR2} / V_{BGR2}^{(0)}) = \{DACin/(2^x - 1)\} \times gm \times V_{BGR2}^{(0)} \times (V_{BGR2} / V_{BGR2}^{(0)}) = \{DACin/(2^x - 1)\} \times gm \times V_{BGR2}. \quad (6)$$

Then, the practical electrical power $P_H$ supplied to the heater may be calculated by:

$$P_H=I_H\times V_{Heater} \quad (7),$$

and the next output $\text{DACin}^{(next)}$ of the controller 13 may be determined by:

$$DAC\text{in}^{(next)}=DAC\text{in}\times P_H^{(target)}/P_H \quad (8)$$

Thus, the electrical power supplied to the heater H may be precisely kept constant independent of the fluctuation due to the temperature dependence of the reference for the D/A-C 14.

The designed second reference $V_{BGR2}^{(0)}$ used in the analyses described above is an optional. For instance, the designed second reference $V_{BGR2}^{(0)}$ may be a value of the output Vout of the continuous BGR 15 when the heater controller is first applied to control the heater H practically.

The heater controller 10 according to the present embodiment has the A/D-C 12 provided with the first reference $V_{BGR1}$ from the chopped BGR 16 and the D/A-C 14 provided with the second reference $V_{BGR2}$ from the continuous BGR 15. The reference provided from the continuous BGR 15 inherently shows substantial temperature dependence, while, the first reference provided from the chopped BGR 16 inherently shows relatively lesser temperature dependence but includes substantial switching noise. Accordingly, the heater controller 10 may precisely control the electrical power supplied to the heater H.

Moreover, the heater controller 10 of the present embodiment may be preferably applicable to control the heater H monolithically integrated within the tunable LD. The tunable LD, in particular, the output wavelength therefrom strongly depends on the electrical power supplied to of the heater H. Accordingly, the heater controller 10 is further preferable for the application of the tunable LD.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

I claim:

1. A load controller, comprising:
a current source to supply a current to a load;
an analog-to-digital converter coupled with a first reference;
a digital-to-analog converter coupled with a second reference that has temperature dependence greater than temperature dependence of said first reference; and
a controller configured to control said current source through said digital-to-analog converter by receiving an output of said analog-to-digital converter,
wherein said controller receives said second reference through said analog-to-digital converter and corrects temperature dependence of said second reference.

2. The controller of claim 1,
wherein said first reference is a type of a chopped bandgap reference, and
wherein said second reference is a type of a continuous bandgap reference.

3. The controller of claim 1,
wherein said analog-to-digital converter monitors a voltage drop caused in said load by flowing said current therein.

4. A method to control electrical power supplied to a load in constant to target power by a feedback loop including an analog-to-digital converter, a controller, a digital-to-analog converter, and a current source, said method comprising steps of:
detecting a voltage drop caused in said load by a current flowing therein through said analog-to-digital converter as referring to a first reference;
detecting a second reference through said analog-to-digital converter, said second reference being referred by said digital-to-analog converter that controls said current source and having temperature dependence greater than temperature dependence of said first reference;
calculating another current next supplied to said load through said digital-to-analog converter and said current source by said controller as correcting said temperature dependence of said second reference; and
providing said calculated current to said load.

5. The method of claim 4,
wherein said step of calculating another current includes steps of:
dividing said target power by said voltage drop to reduce an estimated current; and
correcting said estimated current by multiplying a ratio of said detected second reference to a designed second reference.

6. The method of claim 5,
further including a step of, before said step of detecting said voltage drop, setting said designed second reference by which said target power is first obtained.

7. The method of claim 4,
wherein said step of calculating another current includes steps of:
calculating said current presently flowing in said load from a present output of said controller;
correcting said calculated present current by multiplying a ratio of a designed second reference to said detected second reference;
calculating present electrical power supplied to said load from said corrected current and said voltage drop; and
calculating next output of said controller from said calculated present power and said target power.

8. The method of claim 7,
wherein said step of calculating next output includes a step of multiplying said present output of said controller by a ratio of said target power to said calculated preset power.

9. The method of claim 7,
further including a step of, before said step of detecting said voltage drop, setting said designed second reference by which said target power is first obtained.

* * * * *